United States Patent
Ise et al.

(10) Patent No.: US 11,841,764 B2
(45) Date of Patent: Dec. 12, 2023

(54) CIRCUIT AND METHOD FOR READING ECC FROM MEMORY

(71) Applicant: Infineon Technologies LLC, San Jose, CA (US)

(72) Inventors: Yuichi Ise, Fujisawashi (JP); Clifford Zitlaw, San Jose, CA (US); Nobuaki Hata, Tokyo (JP)

(73) Assignee: Infineon Technologies LLC, San Jose, CA (US)

( * ) Notice: Subject to any disclaimer, the term of this patent is extended or adjusted under 35 U.S.C. 154(b) by 78 days.

(21) Appl. No.: 17/698,729

(22) Filed: Mar. 18, 2022

(65) Prior Publication Data

US 2023/0195564 A1    Jun. 22, 2023

Related U.S. Application Data (60) Provisional application No. 63/290,982, filed on Dec. 17, 2021.

(51) Int. Cl.
  *G06F 11/10* (2006.01)
  *G06F 3/06* (2006.01)

(52) U.S. Cl.
  CPC ........ *G06F 11/1048* (2013.01); *G06F 3/0619* (2013.01); *G06F 3/0656* (2013.01); *G06F 3/0679* (2013.01); *G06F 11/1068* (2013.01)

(58) Field of Classification Search
  CPC ............ G06F 11/1048; G06F 11/1068; G06F 3/0619; G06F 3/0656; G06F 3/0679
  See application file for complete search history.

(56) References Cited

U.S. PATENT DOCUMENTS

| | | | |
|---|---|---|---|
| 7,549,001 B2 * | 6/2009 | Szczypinski | G11C 7/1078 711/149 |
| 9,965,387 B1 * | 5/2018 | Maheshwari | G06F 13/1615 |
| 2004/0205418 A1 * | 10/2004 | Sakaue | G06F 11/1068 714/E11.038 |
| 2007/0277066 A1 * | 11/2007 | Gajapathy | G06F 11/1044 714/724 |

(Continued)

OTHER PUBLICATIONS

Datasheet, "ECC DRAM," Beyond Limits, IM Intelligent Memory, IME2532SDBE(T/B), Dec. 2016, 52 pages.
Datasheet, "eXtra Robustness (XR) ECC DRAM," Beyond Limits, IM Intelligent Memory, IMX2532SDBE(T/B), Jun. 2018, 52 pages.
Jedec Standard, "Low Power Double Data Rate 4 (LPDDR4)," JESD209-4, Jedec Solid State Technology Association, Aug. 2014, 196 pages.

(Continued)

*Primary Examiner* — Guy J Lamarre
(74) *Attorney, Agent, or Firm* — Slater Matsil, LLP (57) ABSTRACT

In an embodiment, a method includes: receiving, via control lines of a parallel interface of a memory device, a first command and a first read command including one or more bits indicative of a first selection that causes a selector circuit to select data from a data memory portion of the memory device; providing, via data lines of the parallel interface, first data from the data memory portion using the selector circuit, where the provided first data is associated with the first read command; receiving, via the control lines, a second command and a second read command including one or more bits indicative of a second selection that causes the selector circuit to select data from an ECC memory portion; and providing, via the data lines, first ECC values from the ECC memory portion using the selector circuit, where the first ECC values are associated with the first data.

25 Claims, 6 Drawing Sheets

(56) References Cited

U.S. PATENT DOCUMENTS

| | | | |
|---|---|---|---|
| 2014/0082260 A1* | 3/2014 | Oh | G06F 12/0246 |
| | | | 711/103 |
| 2015/0309742 A1* | 10/2015 | Amidi | G06F 9/30 |
| | | | 714/773 |
| 2016/0378597 A1* | 12/2016 | Chung | G11C 29/52 |
| | | | 714/764 |
| 2018/0088848 A1* | 3/2018 | Lee | G06F 13/4282 |
| 2020/0225878 A1* | 7/2020 | Shaeffer | G06F 13/4273 |
| 2020/0372940 A1* | 11/2020 | Park | G11C 7/1093 |
| 2021/0042189 A1 | 2/2021 | Whately et al. | |
| 2022/0139485 A1* | 5/2022 | Kim | G11C 29/42 |
| | | | 714/719 |

OTHER PUBLICATIONS

Johnston, A. H., "Space Radiation Effects in Advanced Flash Memories," Non Volatile Memory Technology Symposium 2001, Dec. 2001, 6 pages.

Northwest Logic a Rambus Company, "In-Line ECC Core," Interface IP, Northwest Logic Controllers, Product Brief, Mar. 20, 2020, 1 page.

Wikipedia, "ECC memory," https://en.wikipedia.org/w/index.php?title=ECC_memory&oldid=1056110067, Nov. 19, 2021, 9 pages.

Wikipedia, "Error correction code," https://en.wikipedia.org/w/index.php?title=Error_correction_code&oldid=1051617937, Oct. 24, 2021, 7 pages.

* cited by examiner

| Command | | CS | CA0 | CA1 | CA2 | CA3 | CA4 | CA5 |
|---|---|---|---|---|---|---|---|---|
| ENTER ECC AS (CMD2) | Activate-1 (ACT-1) | H | H | L | R12 | R13 | R14 | R15 |
| | | L | BA0 | BA1 | BA2 | H | R10 | R11 |
| | Activate-2 (ACT-2) | H | H | H | R6 | R7 | R8 | R9 |
| | | L | R0 | R1 | R2 | R3 | R4 | R5 |
| EXIT ECC AS (CMD1) | Activate-1 (ACT-1) | H | H | L | R12 | R13 | R14 | R15 |
| | | L | BA0 | BA1 | BA2 | L | R10 | R11 |
| | Activate-2 (ACT-2) | H | H | H | R6 | R7 | R8 | R9 |
| | | L | R0 | R1 | R2 | R3 | R4 | R5 |

FIG. 5

| Command | | CS | CA0 | CA1 | CA2 | CA3 | CA4 | CA5 |
|---|---|---|---|---|---|---|---|---|
| ENTER ECC AS (CMD2) | Read-1 (RD-1) | H | L | H | L | L | L | BL |
| | | L | BA0 | BA1 | BA2 | H | C9 | AP |
| EXIT ECC AS (CMD1) | Read-1 (RD-1) | H | L | H | L | L | L | BL |
| | | L | BA0 | BA1 | BA2 | L | C9 | AP |

| Command | CS | CA0 | CA1 | CA2 | CA3 | CA4 | CA5 |
|---|---|---|---|---|---|---|---|
| RD FIFO (CMD3) | H | L | L | L | L | L | H |
| | L | H | L | L | L | L | L |

FIG. 9

| Data + ECC output | 1 Read | 8 Reads |
|---|---|---|
| Memory system 200 | 8 clocks for data + 8 clocks for ECC = 16 clocks | 64 clocks for data + 64 clocks for ECC = 128 clocks |
| Memory system 700 | 8 clocks for data + 8 clocks for ECC = 16 clocks | 64 clocks for data + 8 clocks for ECC = 72 clocks |

CIRCUIT AND METHOD FOR READING ECC FROM MEMORY

CROSS-REFERENCE TO RELATED APPLICATIONS

This application claims the benefit of U.S. Provisional Application No. 63/290,982, entitled "Reading Error-Correction Code (ECC) from Non-volatile memory," and filed on Dec. 17, 2021, which application is hereby incorporated herein by reference.

TECHNICAL FIELD

The present disclosure relates generally to an electronic system and method, and, in particular embodiments, to a circuit and method for reading error-correction code (ECC) from memory.

BACKGROUND

An ECC may be understood as a mathematical process that may be used for detecting and/or correcting errors in data. For example, an ECC may be used for detecting and/or correcting errors (e.g., bit flips) that may occur in data stored in a memory and/or during communication of data. In some applications, errors may be detected and corrected in real time. To achieve error detection and/or correction capabilities, an ECC uses redundancy. For example, an ECC may use 8 additional bits per 64 bits of data to achieve, e.g., single error correction (SEC) and double error detection (DED). An example of a conventional ECC is the Hamming code. Other types of ECC may be used.

An ECC may be used when reading from a dynamic random-access memory (DRAM) to detect and/or correct errors of the read data. For example, during a read operation, a memory controller reads data from the DRAM using data bus lines, and reads the ECC associated with the read data using dedicated ECC bus lines. The memory controller then regenerates the ECC based on the read data. If the memory controller determines that there is a match between the read ECC and the regenerated ECC, then no errors are detected. A mismatch between the read ECC and the regenerated ECC is indicative of an error. Depending on the number of errors (e.g., the number of flipped bits) and on the particular ECC, the detected error may be corrected. For example, some DRAMs use a Hamming code-based ECC that allows the memory controller for correcting single-bit errors and for detecting double-bit errors.

SUMMARY

In accordance with an embodiment, a method includes: receiving, via control lines of a parallel interface of a memory device, a first command; after receiving the first command, receiving, via the control lines, a first read command, where the first command or the first read command includes one or more bits indicative of a first selection, where the first selection causes a selector circuit to select data from a data memory portion of the memory device, and where a second selection causes the selector circuit to select data from an error correction code (ECC) memory portion; after receiving the first read command and the first selection, providing, via data lines of the parallel interface, first data from the data memory portion using the selector circuit, where the provided first data is associated with the first read command; receiving, via the control lines, a second command; after receiving the second command, receiving, via the control lines, a second read command, where the second command or the second read command includes one or more bits indicative of the second selection; and after receiving the second read command and the second selection, providing, via the data lines, first ECC values from the ECC memory portion using the selector circuit, where the first ECC values are associated with the first data.

In accordance with an embodiment, a method includes: receiving, via control lines of a parallel interface of a memory device, a first read command; in response to receiving the first read command: providing, via data lines of the parallel interface, first data from a first memory portion, where the provided first data is associated with the first read command, and copying first error correction code (ECC) values from an ECC memory portion of the memory device to a buffer, where the first ECC values are associated with the first data; after receiving the first read command, receiving, via the control lines, a buffer read command; and after receiving the buffer read command, providing, via the data lines, the first ECC values from the buffer.

In accordance with an embodiment, an integrated circuit includes: a parallel interface configured to receive commands via control lines and configured to deliver data via data lines; a data memory portion configured to store data; an error correction code (ECC) memory portion configured to store ECC values associated with the data stored in the data memory portion; a buffer; a selector circuit having a first input coupled to a data output of the data memory portion, and a second input coupled to a data output of the ECC memory portion; and a controller configured to: after reception, by the parallel interface, of a first read command via the control lines, cause the selector circuit to select the first input and cause the parallel interface to provide, via the data lines, first data from the first input of the selector circuit, where the provided first data is associated with the first read command, after reception, by the parallel interface, of a second command via the control lines, cause the selector circuit to select the second input and cause the parallel interface to provide, via the data lines, first ECC values using from the second input of the selector circuit, where the first ECC values are associated with the first data.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., a low power double data rate (DDR)4 (LPDDR4)-compatible flash memory with ECC capabilities. Some embodiments may be implemented without being (e.g., fully) compatible with the LPDDR4 standard and/or while complying with other standards or without (e.g., fully) complying with any particular standard. Some embodiments may be implemented with other types of memory technologies, such as with volatile memories and other types of non-volatile memories.

Communication standards are generally used to facilitate the adoption of a particular technology. A digital communication standard defines a set of rules for information exchange, such as defining a set of digital communication lines and associated properties (e.g., direction, type of data being carried, timing requirements, etc.) of the digital signals being carried in such digital communication lines, e.g., to interface with a device.

Examples of digital communication standards include DDR, DDR2, DDR3, DDR4, DDR5, LPDDR(1), LPDDR2, LPDDR3, LPDDR4, LPDDR4, LPDDR4X, LPDDR5, LPDDR5X, I²C, USB 3.2 (or earlier), etc.

Communication standards may be published by a standard organization. Examples of a standard organization include JEDEC, IEEE, ISO, USB-IF. In some cases, a non-standard organization, such as a company, publishes communication protocol specifications that may be later adopted as an industry standard (e.g., Phillips Semiconductors originally published the I2C specification).

Low power double data rate4 (LPDDR4), e.g., as published in August 2014 and associated with number JESD209-4, is a standard defined by JEDEC Solid State Technology Association (also referred to as JEDEC) for interfacing/communicating with synchronous DRAM. LPDDR4 does not natively support ECC.

In an embodiment of the present invention, a non-volatile memory, such as a flash memory, stores data and associated ECC. The non-volatile memory allows for an LPDDR4 memory controller to perform read operations of the non-volatile memory to retrieve from the non-volatile memory read data and associated ECC via the DQ lines without requiring hardware modifications of memory controller, such as without requiring additional communication lines for reading the ECC. In some embodiments, after a read operation, the multipurpose command (MPC) is used to retrieve the ECC via the DQ lines. In some embodiments, one or more reserved or unused bit(s) as defined by the LPDDR4 standard is/are used to select the address space to be accessed with a read operation (e.g., either the data space or the ECC space). In some embodiments, the one or more reserved or unused bit(s) are located in a reserved register of the LPDDR4 standard. In some embodiments, the one or more reserved or unused bit(s) are part of a standard command as defined by the LPDDR4 standard, such as a part of the activate command or read command.

Figure 1:
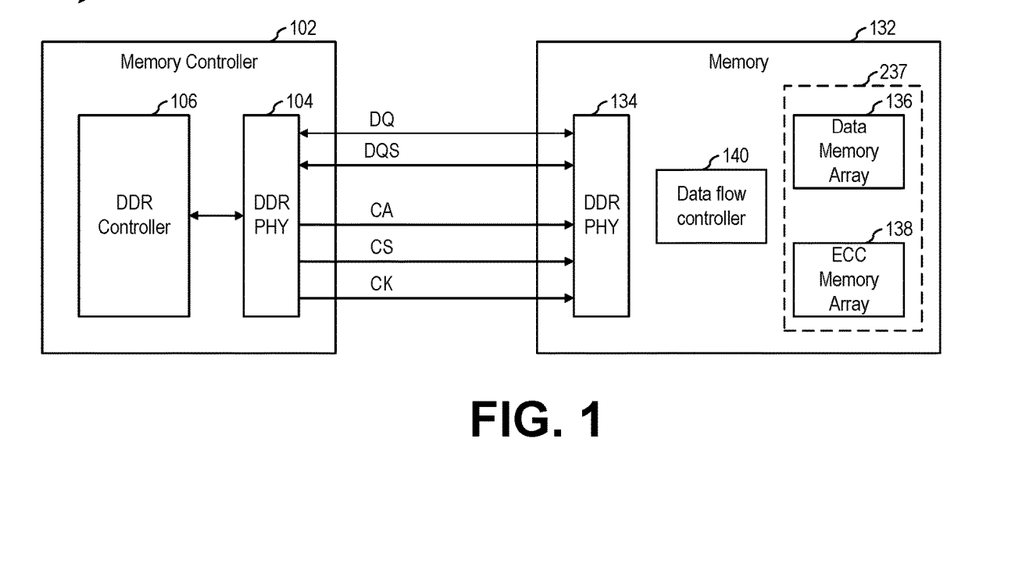
FIG. 1 shows a schematic diagram of memory system wo, according to an embodiment of the present invention.

FIG. 1 shows a schematic diagram of memory system 100, according to an embodiment of the present invention. Memory system wo includes memory controller 102 and memory 132. Memory controller 102 includes DDR physical layer (PHY) 104 and DDR controller 106. Memory 132 includes DDR PHY 134, data memory array 136, ECC memory array 138, and data flow controller 140. In some embodiments, memory system 100 is compatible and complies with the LPDDR4 standard.

As shown in FIG. 1, in some embodiments, DDR PHY 104 and DDR PHY 134 are connected with data input/output (DQ), data strobe (DQS), command/address (CA), clock (CK) and chip select (CS) lines (other lines not shown may also connect DDR PHY 104 with DDR PHY 134). CA and CS may be used to provide commands to DDR PHY 134 (e.g., based on the CK line(s)). DQ and DQS lines are data and data strobe lines, respectively, of a bidirectional data bus.

In some embodiments, DDR PHY 104 provides to DDR PHY 134 command address signal(s) CA, clock signal(s) CK and chip select signals. Data signal(s) DQ and data strobe signal(s) DQS may be provided by DDR PHY 104 or by DDR PHY 134 depending on whether memory controller 102 is writing to memory 132 or reading from memory 132, respectively.

In some embodiments, data memory array 136 is configured to store data (e.g., written by memory controller 102 via DQ lines).

In some embodiments, memory 132 includes a plurality of data memory arrays 136, e.g., implemented in respective memory banks, where the bank selection may be controlled with bank address bis (e.g., such as bits BA0, BA1, and BA2 of the read command or activate command, as defined by the LPDDR4 standard).

In some embodiments, ECC memory array 138 is configured to store ECC associated with the data stored in data memory array 136. For example, in some embodiments, ECC memory array 138 may include the same number of addresses as data memory array 136, and may store in each address the ECC corresponding to the data stored in the same address in memory array 136. Other implementations are also possible.

In some embodiments, ECC memory array 138 may be smaller than data memory array 136. For example, in embodiments in which 8 ECC bits are used per 64 bits of data, ECC memory array 138 may be 8 times smaller than data memory array 136, e.g., while having the same number of addresses.

In some embodiments, memory arrays 136 and 138 may be implemented with flash memory, such as with NOR flash or NAND flash, for example. Other implementations, such as using non-flash memories, such as using volatile memories, are also possible.

In some embodiments, DDR PHYs 104 and 134 are configured to transmit and receive commands, respectively, e.g., using the CA, CS and CK lines, and may receive or transmit data using the DQ and DQS lines. In some embodiments, DDR PHYs 104 and 134 may be implemented in any way known in the art. For example, in some embodiments, DDR PHYs 104 and/or 134 may comply or be compatible with the LPDDR4 standard.

In some embodiments, DDR controller 106 is configured to operate memory 132, e.g., for reading or writing data using DDR PHY 104. In some embodiments, DDR controller 106 may be implemented with a generic or custom controller or processor capable of executing instructions stored in a memory. In some embodiments, DDR controller 106 may be implemented using a state machine. Other implementations are also possible.

In some embodiments, memory controller 102 is implemented as a standalone controller, e.g., in an integrated circuit (IC). In some embodiments, Memory controller 102 is implemented inside an IC such as a system-on-chip (SoC) that includes other circuits, such as a microcontroller, ADCs, DACs, etc.

In some embodiments, memory 132 is implemented in a single IC, which may include a single die or a plurality of dies. In some embodiments, memory 132 may be implemented using a plurality of ICs.

In some embodiments, DQ lines are bidirectional lines for transmitting data between memory controller 102 and memory 132 based on one or more DQS lines. In some embodiments, DQS lines are bidirectional clock lines used to strobe data in the DQ lines for read or write operations. For example, in some embodiments, during a read operation, DDR PHY 132 provides a clock signal via a DQS line while providing the read data via the DQ lines edge-aligned with the clock signal of the DQS line. In some embodiments, during a write operation, DDR PHY 102 provides a clock signal via the DQS line while providing write data via the DQ lines edge-aligned with the clock signal of the DQS line.

Some embodiments include a pair of differential DQ lines per group of DQ lines. For example, in some embodiments, a pair of DQS lines for carrying a differential clock is provided for each 8-bit byte lanes (DQ). For example, in some embodiments, each communication channel includes 16 DQ lines for carrying 16-bit data (8-bits associated with an upper byte and 8-bits associated with a lower byte), and 2 pairs of DQS lines for carrying a differential clock for the upper byte and the lower byte, respectively. Other implementations are also possible. For example, embodiments having 4, 8, 32, and 64 DQ lines are also possible.

In some embodiments, CS and CA lines are used to provide commands to memory 132, e.g., based on the (e.g., differential) CK lines (e.g., based on a clock signal provided in the CK lines). Examples of possible commands that may be provided using the CS and CA lines include: a read command, a write command, a multipurpose command (MPC), and an activate command (e.g., as defined in the LPDDR4 standard). For example, in some embodiments, an activate command is used before any read or write command, e.g., to provide bank and address selection. In some embodiments, a read command (which may be a single read or a burst read operation) causes memory 132 to provide in the DQ lines data associated with the address and bank selected using a previous activate command. In some embodiments, a write command (which may be a single write or a burst write operation) causes memory 132 to store data from the DQ lines in data memory storage associated with the address and bank selected in a previous activate command. In some embodiments, an MPC command causes memory 132 to access one or more training modes.

Some embodiments include 6 CA lines, 1 CS line, and a differential clock line CK per communication channel. Other implementations are also possible.

In some embodiments, data flow controller 140 is configured to cause DDR PHY 134 to provide, using the DQ lines, ECC values associated with data read during a read command, where the ECC values are stored in ECC memory array 138. In some embodiments, data flow controller 140 includes a state machine configured to cause DDR PHY 134 to provide the ECC values in response to a read command. In some embodiments, data flow controller 140 includes a generic or custom controller or processor configured to execute instructions in a memory. Other implementations are also possible.

Although data memory array 136 and ECC memory array 138 have been illustrated as two separate arrays, in some embodiments, data memory array 136 and ECC memory array 138 are part of the same memory array. For example, in some embodiments, data and associated ECC values are interleaved within a single array. Other implementations are also possible.

Figure 2:
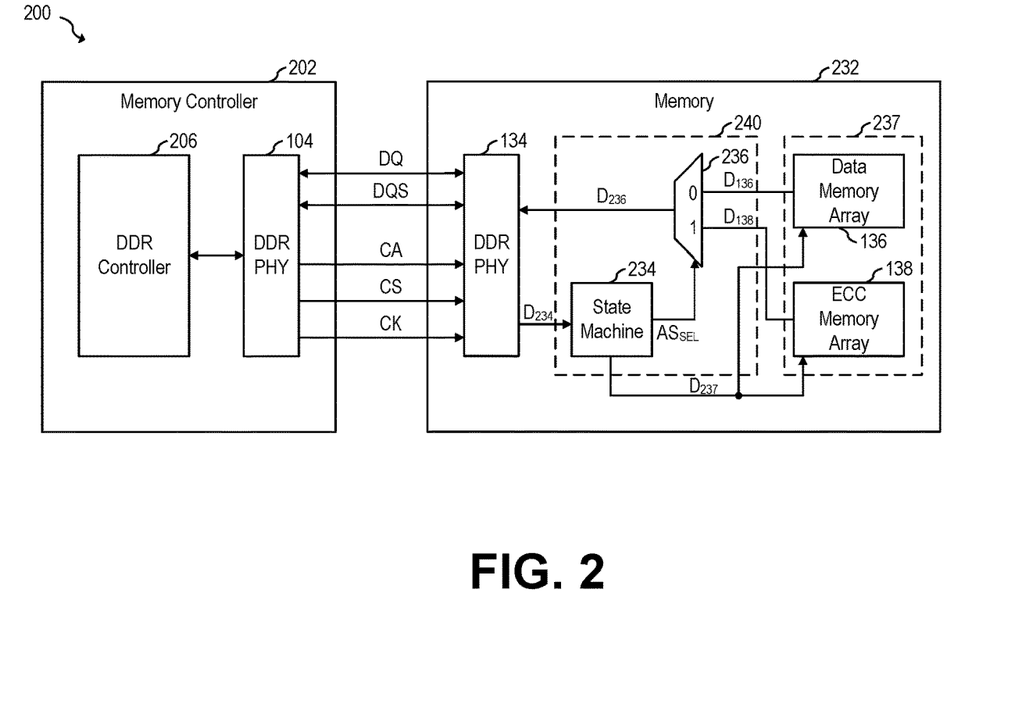
FIG. 2 shows a schematic diagram of a memory system, according to an embodiment of the present invention.

FIG. 2 shows a schematic diagram of memory system 200, according to an embodiment of the present invention. Memory system 200 includes memory controller 202 and memory 232. Memory controller 202 includes DDR PHY 104 and DDR controller 206. Memory 232 includes DDR PHY 134, data flow controller 240, and memory storage 237. Memory storage 237 includes data memory array 136, and ECC memory array 138. Data flow controller 240 includes state machine 234 and multiplexer (MUX) 236. Memory 132 may be implemented as memory 200. Data flow controller 140 may be implemented as data flow controller 240. Memory controller 102 may be implemented as memory controller 202. DDR controller 106 may be implemented a DDR controller 206.

In some embodiments, memory system 200 is compatible and complies with the LPDDR4 standard.

During normal operation, when memory controller 202 issues a read command, DDR PHY 134 provides data in the DQ lines from arrays 136 or 138 depending on the output of MUX 236. MUX 236 selects whether to provide data from data memory array 126 or from ECC memory array 138 to data bus $D_{236}$ based on address space selection signal $AS_{SEL}$. In some embodiments, state machine 234 determines the state of address space selection signal $AS_{SEL}$ based on one or more bits received in the CA and/or CS lines during a read command or prior to the read command. For example, in some embodiments, prior to sending a read command to memory 232, DDR controller 206 sends a command (e.g., an activate command) selecting the state of address space signal $AS_{SEL}$. In some embodiments, DDR controller 206 selects the state of address space signal $AS_{SEL}$ using a bit of the read command.

State machine 234 is configured to receive command and address details from DDR PHY 134 (based on data received from CA and CS lines), and to control MUX 236, data memory array 236 and ECC memory array 238 based on such received commands. In some embodiments, state machine 234 may be implemented using logic gates and flip-flops. In some embodiments, state machine 234 may be programmable. Other implementations are also possible.

In some embodiments, bus $D_{234}$ carries details about the command received, such as type of command (e.g., read, write, MPC, etc.) and associated parameters (e.g., BL, AP, etc.), as well as addressing details, such as row/column address, and bank address.

In some embodiments, bus $D_{237}$ carries memory addresses (e.g., row/column address, bank address) as well as instructions (e.g., using one or more control signals) to cause the storage or transmission of data.

In some embodiments, bus $D_{136}$ carries data from data memory array 136 associated with the memory addresses received from bus $D_{237}$. In some embodiments, bus $D_{138}$ carries data from ECC memory array 138 associated with the memory addresses received from bus $D_{237}$.

In some embodiments, signal ASSEL is assigned to an address space selection bit in a register of memory 232. When the address space selection bit is asserted (e.g., logic 1), the ECC memory space is selected; when the address space selection bit is deasserted (e.g., logic 0) the data memory space is selected. In some embodiments, a command, e.g., received using the CA, CS, and CK lines, may cause the address space selection bit to be asserted or deasserted (e.g., based on the content of the command received).

Figure 3:
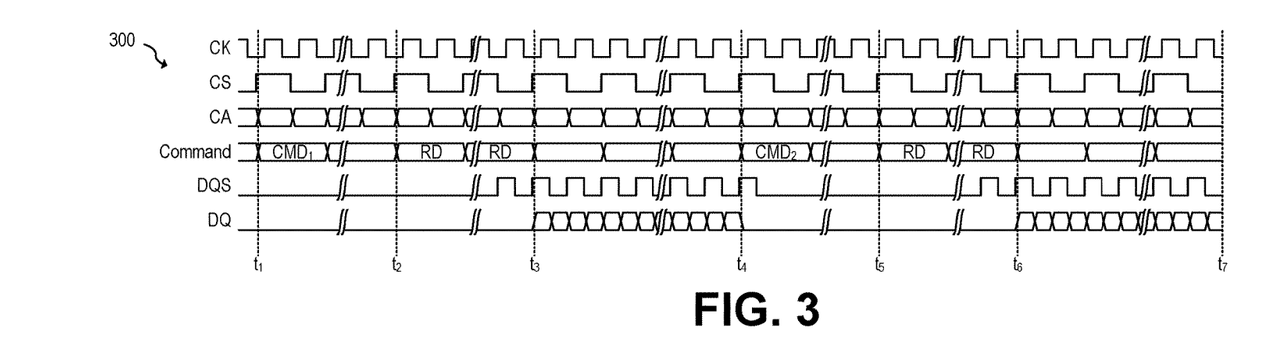
FIG. 3 shows waveforms of the memory system of FIG. 2, according to an embodiment of the present invention.

FIG. 3 shows waveforms 300 of memory system 200, according to an embodiment of the present invention. FIG. 3 may be understood in view of FIG. 2.

As shown in FIG. 3, at time $t_1$, memory controller 202 sends a first command $CMD_1$ to memory 232 using the CA, CS, and CK lines, where command $CMD_1$ includes one or more bits to deassert (e.g., to logic 0) signal $AS_{SEL}$ to cause MUX 236 to provide data from data memory array 136. At time $t_2$, memory controller 202 sends a read command RD to memory 232 using the CA, CS, and CK lines. Since command $CMD_1$ caused signal $AS_{SEL}$ to be deasserted, MUX 236 provides data from data memory array 136 in response to the reception of the read command RD, which is then transmitted to memory controller 202 using the DQ and DQS lines, beginning at time $t_3$.

At time $t_4$, and after the read operation finishes, memory controller 202 sends a second command $CMD_2$ to memory 232 using the CA, CS, and CK lines, where command $CMD_2$ includes one or more bits to assert (e.g., to logic 1) signal $AS_{SEL}$ to cause MUX 236 to provide data from ECC memory array 138. At time $t_5$, memory controller 202 sends a read command RD to memory 232 using the CA, CS, and CK lines. Since command $CMD_2$ caused signal $AS_{SEL}$ to be asserted, MUX 236 provides data from ECC memory array 138 in response to the reception of the read command RD, which is then transmitted to memory controller 202 using the DQ and DQS lines, beginning at time to.

In some embodiments, the read command RD transmitted beginning at time $t_5$ is associated with the same address of the read command RD transmitted beginning at time $t_2$ such that the ECC transmitted beginning at time to is associated with the data transmitted beginning at time $t_3$. In some embodiments, ECC data transmitted beginning at time to may not be associated (e.g., may be associated with a different address) with the data transmitted beginning at time $t_3$.

Although FIGS. 2 and 3 illustrate an embodiment in which asserting signal $AS_{SEL}$ to select the ECC memory space corresponds to a logic 1, and deasserting signal $AS_{SEL}$ to select the data memory space corresponds to a logic 0, it is understood that an opposite polarity may also be used.

Figure 4A:
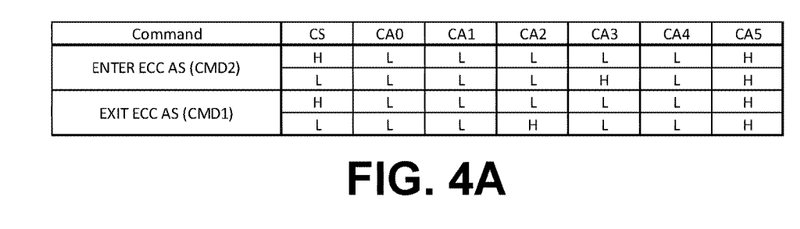
FIGS. 4A-4C show possible commands for entering and exiting the ECC address space of FIG. 2, according to an embodiment of the present invention.
Figure 4B:
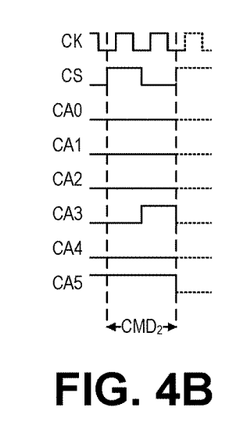
Figure 4C:
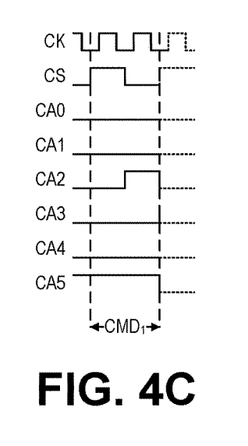

FIG. 4A shows a possible implementation of commands $CMD_1$ and $CMD_2$, according to an embodiment of the present invention. FIGS. 4B and 4C show waveforms associated with the commands $CMD_1$ and $CMD_2$, respectively, illustrated in FIG. 4A, according to an embodiment of the present invention. The embodiment shown in FIGS. 4A-4C uses 6 CA lines, 1 CS line, and a differential clock line CK per communication channel (only one clock signal of the differential clock line CK is illustrated in FIGS. 4B and 4C for clarity purposes). Other implementations are also possible. Memory system 200 may implement commands $CMD_1$ and $CMD_2$ as shown in FIGS. 4A-4C.

As shown in FIG. 4A-4C, in some embodiments, a command is formed by bits transmitted during the high state of CS line and during the low state of CS line.

Figure 5:
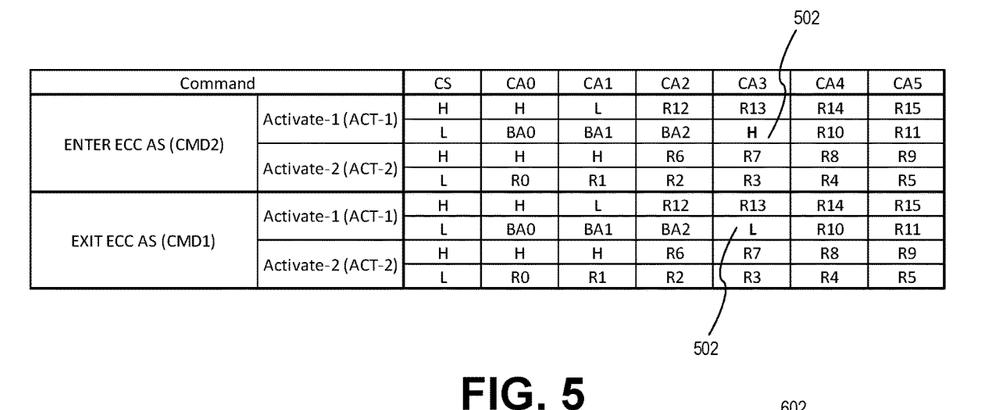
FIG. 5 shows address space selection commands implemented as part of activate commands, according to an embodiment of the present invention.

With respect to FIG. 3, in some embodiments, when using the commands $CMD_1$ and $CMD_2$ illustrated in FIGS. 4A-4C, an activate command is transmitted after command $CMD_1$ and before time $t_2$, and an activate command is transmitted after command $CMD_2$ and before time $t_5$. In some embodiments, such activate commands may be implemented as shown in FIG. 5, with bit 502 being a don't care (may be either low or high). In some embodiments, other commands, such as CAS-2 and deselect commands (not shown), may also be transmitted between time $t_1$ and $t_7$.

In some embodiments, implementing commands $CMD_1$ and $CMD_2$ as shown in FIGS. 4A-4C advantageously allows for remaining compatible with the LPDDR4 standard while allowing the transmission of ECC values using the DQ and DQS lines, since the LPDDR4 defines the commands illustrated in FIGS. 4A-4C as reserved commands (RFU) that are part of the MPC command. Other commands may also be used. For example, in some embodiments, the command illustrated in FIGS. 4A and 4B as command $CMD_2$ may be used as command $CMD_1$ and the command illustrated in FIGS. 4A and 4C as command $CMD_1$ may be used as command $CMD_2$. In some embodiments, $CMD_1$ and $CMD_2$ may be implemented as part of a Mode Register Write (MRW) command of the LPDDR4 standard, such as, for example, MR26.

In some embodiments, commands $CMD_1$ and $CMD_2$ are implemented using an activate command. For example, FIG. 5 shows commands $CMD_1$ and $CMD_2$ implemented as part of activate commands, according to an embodiment of the present invention. The embodiment shown in FIG. 5 uses 6 CA lines, 1 CS line, and a differential clock line CK per communication channel, where data from the 6 CA lines is transmitted during the high state of the CS line and then during the low state of the CS line, e.g., in a similar manner as illustrated in FIGS. 4B and 4C. Other implementations are also possible. Memory system 200 may implement commands $CMD_1$ and $CMD_2$ as shown in FIG. 5.

As shown in FIG. 5, in some embodiments, the activate command is formed by bits transmitted during the high state of CS line and during the low state of CS line during 2 cycles of the CS line (commands ACT-1 followed by command ACT-2 form the activate command).

As shown in FIG. 5, the activate command includes bits BA0-BA2 (to indicate the memory bank to be addressed) and bits R0-R15 (to indicate the memory row address to be used, e.g., during the following read command). As shown in FIG. 5, in some embodiments, bit 502 is used to indicate the state of signal $AS_{SEL}$. For example, memory controller 202 asserts (e.g., high) bit 502 during the activate command preceding a read command to read ECC data from ECC memory array 138, and deasserts (e.g., low) bit 502 during the activate command preceding a read command to read data from data memory array 136.

In some embodiments, implementing commands $CMD_1$ and $CMD_2$ as shown in FIG. 5 advantageously allows for remaining compatible with the LPDDR4 standard while allowing the transmission of ECC values using the DQ and DQS lines (e.g., where the DQ lines carry the data and DQS line(s) carry the clock associated with the data), since the LPDDR4 defines bit 502 as a bit that is required to have a defined state (either low or high) but without associating a function to it).

In some embodiments, other bits of the activate command may be used to set the state of signal $AS_{SEL}$. For example, in embodiments in which memory 232 is a 4 Gb memory including 2 dies, with 2 channels per die, and 8 banks per channel, bits R10-R15 are unused. In some such embodiments, one of bits R14-R15 may be used to set the state of signal $AS_{SEL}$ (e.g., in a similar manner as described with respect to bit 502). As another example, in embodiments in which memory 232 is a 256 Mb memory distributed in 8 banks, bits R11-R15 are unused. IN some such embodiments, one of bits R11-R15 may be used to set the state of signal $AS_{SEL}$.

In some embodiments, selecting the address space (between ECC address space and data address space) by using an unused bit of the activate command (e.g., and unused R-bit of the activate command) advantageously allows for remaining compatible with the LPDDR4 standard while allowing the transmission of ECC values using the DQ and DQS lines.

In some embodiments, commands $CMD_1$ and $CMD_2$ are implemented using a read command. For example, in some embodiments, the read command RD occurring at times $t_2$ and $t_5$ may be replaced by $CMD_1$ an $CMD_2$, respectively, instead of performing $CMD_1$ and $CMD_2$ at times $t_1$ and $t_4$, respectively.

Figure 6:
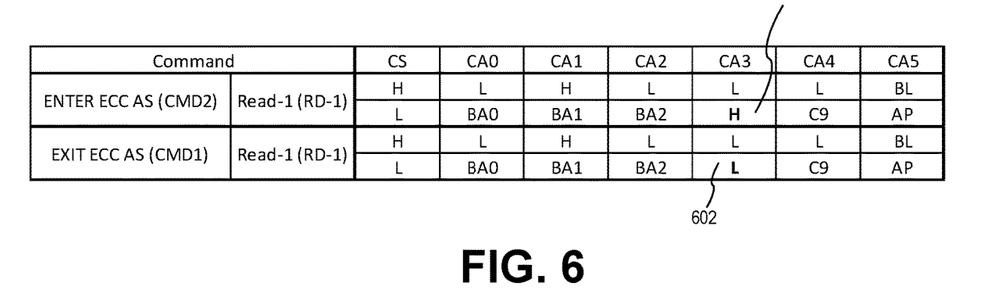
FIG. 6 shows address space selection commands implemented as part of read commands, according to an embodiment of the present invention.

FIG. 6 shows commands $CMD_1$ and $CMD_2$ implemented as part of read commands, according to an embodiment of the present invention. The embodiment shown in FIG. 6 uses 6 CA lines, 1 CS line, and a differential clock line CK per communication channel, where data from the 6 CA lines is transmitted during the high state of the CS line and then during the low state of the CS line, e.g., in a similar manner as illustrated in FIGS. 4B and 4C. Other implementations are also possible. Memory system 200 may implement commands $CMD_1$ and $CMD_2$ as shown in FIG. 6.

As shown in FIG. 6, in some embodiments, the read command is formed by bits transmitted during the high state of CS line and during the low state of CS line.

As shown in FIG. 6, the read command includes bits BA0-BA2 (to indicate the memory bank to be addressed) bit BL to control the read burst length (e.g., 16 or 32), bit to control the auto-precharge function, and bit C9, which, together with bits C8-C0 of command CAS-2 (not shown) form the column address to be address. As shown in FIG. 6, in some embodiments, bit 602 is used to indicate the state of signal $AS_{SEL}$. For example, memory controller 202 asserts (e.g., high) bit 602 during the read command to read ECC data from ECC memory array 138, and deasserts (e.g., low) bit 602 during the read command to read data from data memory array 136.

In some embodiments, implementing commands $CMD_1$ and $CMD_2$ as shown in FIG. 6 advantageously allows for remaining compatible with the LPDDR4 standard while allowing the transmission of ECC values using the DQ and DQS lines (e.g., where the DQ lines carry the data and DQS line(s) may carry the clock associated with the data), since the LPDDR4 defines bit 602 as a bit that is required to have a defined state (either low or high) but without associating a function to it).

In some embodiments, other bits of the read command may be used to set the state of signal $AS_{SEL}$. For example, in embodiments that disable the burst length function, bit BL may be used to set the state of signal $AS_{SEL}$ (e.g., in a similar manner as described with respect to bit 502). In embodiments that disable the auto pre-charge function (such as in non-volatile memory embodiments, which may not use the auto pre-charge function), bit AP may be used to set the state of signal $AS_{SEL}$ (e.g., in a similar manner as described with respect to bit 502).

In some embodiments, selecting the address space (between ECC address space and data address space) by using an unused bit of the read command (e.g., a bit corresponding to an unused function) advantageously allows for remaining compatible with the LPDDR4 standard while allowing the transmission of ECC values using the DQ and DQS lines.

Advantages of some embodiments include the provision by a (e.g., non-volatile) memory of ECC values associated with read data using the same data bus (e.g., DQ and DQS lines), thereby advantageously avoiding the use of additional communication lines for the provision of ECC values (which may require additional pins in the memory and/or in the memory controller) while increasing the reliability of the memory (by providing ECC).

Advantages of some embodiments include allowing for a (e.g., non-volatile) memory remaining compatible and complying with the LPDDR4 standard while providing ECC values associated with read data, which may advantageously allow for the reuse of an LPDDR4 memory controller without any hardware modifications (in some embodiments, minor firmware modifications may be performed to the LPDDR4 memory controller to accommodate for the commands for retrieving ECC values via the DQ and DQS lines).

Figure 7:
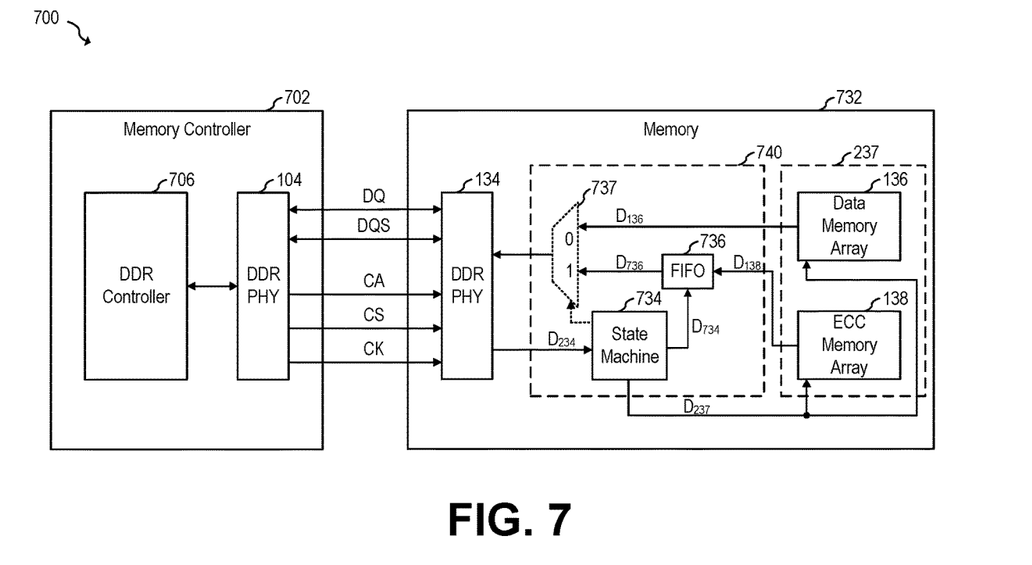
FIG. 7 shows a schematic diagram of a memory system, according to an embodiment of the present invention.

FIG. 7 shows a schematic diagram of memory system 700, according to an embodiment of the present invention. Memory system 700 includes memory controller 702 and memory 732. Memory controller 702 includes DDR PHY 104 and DDR controller 706. Memory 732 includes DDR PHY 134, data flow controller 740, and memory storage 237. Data flow controller 740 includes state machine 734 and first-in-first-out FIFO buffer 736. Memory 132 may be implemented as memory 700. Data flow controller 140 may be implemented as data flow controller 740. Memory controller 102 may be implemented as memory controller 702. DDR controller 106 may be implemented a DDR controller 706.

In some embodiments, memory system 700 is compatible and complies with the LPDDR4 standard.

Memory system 700 operates in a similar manner as memory system 200. Memory system 700, however, uses FIFO buffer 736 to temporarily store ECC values in response to a read command. For example, in some embodiments, in response to receiving a read command, memory 732 provides the requested data from data memory array 136 and (e.g., automatically and/or simultaneously) provides the associated ECC value from ECC memory array 138 to FIFO buffer 136. In a subsequent command, memory controller 702 may request the data from FIFO buffer 736, which may be provided by DDR PHY 134 using the DQ and DQS lines.

State machine 734 is configured to receive command and address details from DDR PHY 134 (based on data received from CA and CS lines), and to cause the transfer of data from data memory array 136 to DDR PHY 134 and from ECC memory array 138 to FIFO buffer 736 in response to receiving a read command. State machine 734 is also configured to cause the transfer of data from FIFO buffer 736 to DDR PHY 134 in response to a FIFO read command. In some embodiments, state machine 734 may be implemented using logic gates and flip-flops. In some embodiments, state machine 734 may be programmable. Other implementations are also possible.

In some embodiments, bus $D_{734}$ carries control signals to cause FIFO buffer 736 to transmit data stored in the FIFO buffer 736 (e.g., ECC values) via bus $D_{736}$.

In some embodiments, bus $D_{736}$ carries data from FIFO buffer 736.

In some embodiments, an additional MUX (737) receives bus $D_{136}$ and $D_{736}$ in first and second inputs and selectively provides the selected output to DDR PHY 134 (e.g., in a similar manner as MUX 236) based on an output from state machine 734, where state machine 734 causes MUX 236 to select bus $D_{136}$ in response to receiving a read request and selects bus $D_{736}$ in response to receiving a FIFO read request. In some embodiments, such selection is performed inside DDR PHY 134 and MUX 737 may be omitted or implemented inside DDR PHY 134.

In some embodiments, FIFO buffer 736 is configured to store ECC values from ECC memory array 138. In some embodiments, FIFO buffer 736 is also configured to store data associated with MPC based training. In some embodiments, FIFO buffer 736 may be implemented in any way known in the art.

Figure 8:
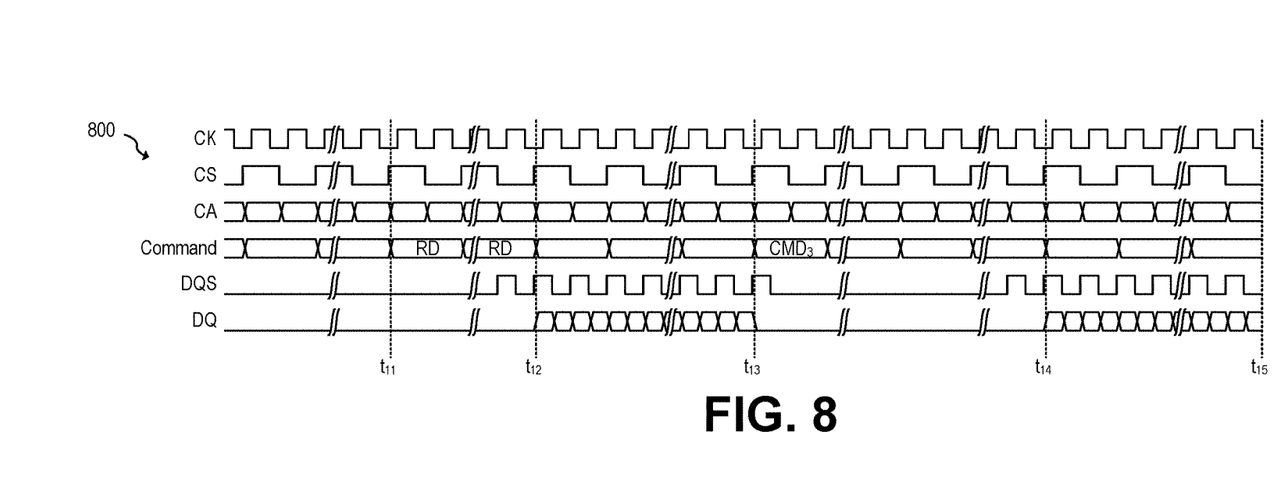
FIG. 8 shows waveforms of memory system of FIG. 7, according to an embodiment of the present invention.

FIG. 8 shows waveforms 800 of memory system 700, according to an embodiment of the present invention. FIG. 8 may be understood in view of FIG. 7.

As shown in FIG. 8, at time $t_{11}$, memory controller 702 sends a read command RD to memory 732 using the CA, CS, and CK lines. In response to receiving the read command RD, state machine 734 causes data memory array 136 to provide the requested read data to DDR PHY 134, which then transmits the requested read data using the DQ and DQS lines, beginning at time $t_{12}$. In response to receiving the read command RD, state machine 734 also causes ECC values associated with the requested read data to be copied from ECC memory array 138 to FIFO buffer 736. In some embodiments, the copying of the ECC values occurs between times $t_{12}$ and t13. In some embodiments, the coping of the ECC values occurs before time $t_{12}$.

At time $t_{13}$, and after the read operation finishes, memory controller 702 sends a command $CMD_3$ to memory 232 using the CA, CS, and CK lines, where command $CMD_3$ includes a FIFO read request to read from FIFO buffer 736. In response to the FIFO read request, state machine 734 causes FIFO buffer 736 to provide the stored ECC values to DDR PHY 134, which then transmits such ECC values using the DQ and DQS lines, beginning at time $t_{14}$.

In some embodiments, the ECC values transmitted beginning at time $t_{14}$ are associated with the data (and transmitted in the same order than the data) transmitted beginning at time $t_{12}$.

In some embodiments, the read command RD shown in FIG. 8 is implemented as illustrated in FIG. 6, with bit 602 being a don't care (having a high state or a low state).

Figures 9, 10:
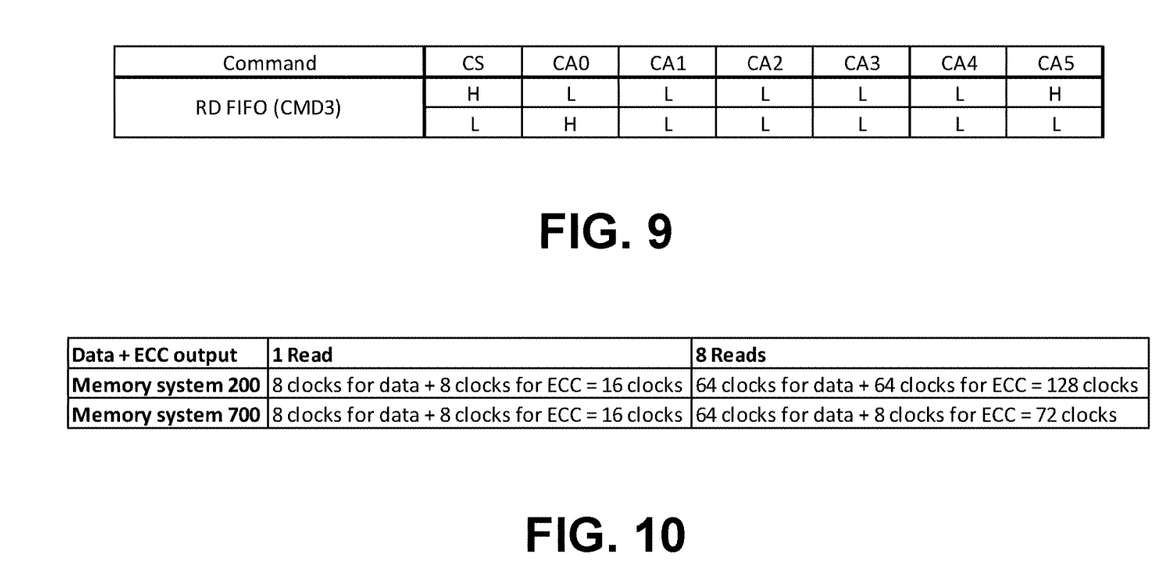
FIG. 9 shows an ECC retrieval command from a FIFO buffer, according to an embodiment of the present invention.
FIG. 10 illustrates a performance comparison between the memory systems of FIGS. 2 and 7, according to embodiments of the present invention.

FIG. 9 shows a possible implementation of command $CMD_3$, according to an embodiment of the present invention. The embodiment shown in FIG. 9 uses 6 CA lines, 1 CS line, and a differential clock line CK per communication channel, where data from the 6 CA lines is transmitted during the high state of the CS line and then during the low state of the CS line, e.g., in a similar manner as illustrated in FIGS. 4B and 4C. Other implementations are also possible. Memory system 700 may implement command $CMD_3$ as shown in FIG. 9.

With respect to FIG. 8, in some embodiments, when the transmission of command $CMD_3$ is immediately followed by a CAS-2 command (not shown) consecutively and without any other commands in-between.

In some embodiments, implementing command $CMD_3$ as shown in FIG. 9 advantageously allows for remaining compatible with the LPDDR4 standard while allowing the transmission of ECC values using the DQ and DQS lines, since the LPDDR4 defines the commands illustrated in FIG. 9 as an MPC for use to retrieve data from a FIFO buffer used during read or write training operations (and, such command is not used, during non-training, and thus, may be used to access FIFO buffer 736 to retrieve data stored in FIFO buffer 736 after a read command).

FIG. 10 illustrates a performance comparison between memory system 200 and memory system 700, according to embodiments of the present invention.

As illustrated in FIGS. 3 and 10, memory system 200 uses a read command (command RD after command $CMD_2$) to retrieve ECC values from ECC memory array 138 in a similar manner as memory system 200 uses a read command (command RD after command $CMD_1$) to retrieve data from data memory array 136 (e.g., with the same address settings, as provided by the respective activate and RD commands). Thus, in some embodiments implemented as memory system 200, the same number of cycles may be used to retrieve data as to retrieve the associated ECC values. For example, in an embodiment in which 8 bits of ECC values are used for each 64 bits of data, during 8 read operations (e.g., during a burst read for retrieving 8×256 bits of data using 16 DQ lines with DDR), 64 clocks pulses (128 clock edges) are used for retrieving the 8×256 bits of data and 64 clocks pulses (128 clock edges) are used for retrieving 8×32 bits of ECC values for a total of 128 clocks pulses to retrieve 8×256 bits of data plus 8×32 bits of ECC values by memory controller 202. In some embodiments, unused ECC bits (e.g., bits 33 to 256 for each ECC read) may be set to a default state (e.g., logic 0).

As illustrated in FIGS. 8 and 10, memory system 700 uses a separate command (command $CMD_3$) to retrieve ECC values from FIFO buffer 736 than the read command (command RD) used to retrieve data from data memory array 136. Thus, in some embodiments, the number of clock pulses used to retrieve a set of ECC values from FIFO buffer 736 may be different from the number of clock pulses used to retrieve the data. For example, as illustrated in FIG. 10, in some embodiments, memory system 700 may use a different (e.g., fixed) number of clock pulses (e.g., 8 clock pulses) to retrieve data from FIFO buffer 736. For example, in an embodiment in which 8 bits of ECC values are used for each 64 bits of data, during 8 read operations (e.g., during a burst read for retrieving 8×256 bits of data using 16 DQ lines with DDR), 64 clock pulses (128 clock edges) are used for retrieving 8×256 bits of data and 8 clock pulses (16 clock edges) are used for retrieving 8×32 bits of ECC values for a total of 72 clock pulses to retrieve 8×256 bits of data plus 8×32-bits of ECC values by memory controller 202.

As illustrated in FIG. 10, in some embodiments, using a (e.g., FIFO) buffer to temporarily store ECC values during a read command, and then transmitting the ECC values using DQ and DQS lines in response to a buffer read command may advantageously result in higher performance (e.g., faster transmission of data plus associated ECC values) than when using a read command to retrieve the ECC values from an ECC memory array.

Figure 11:
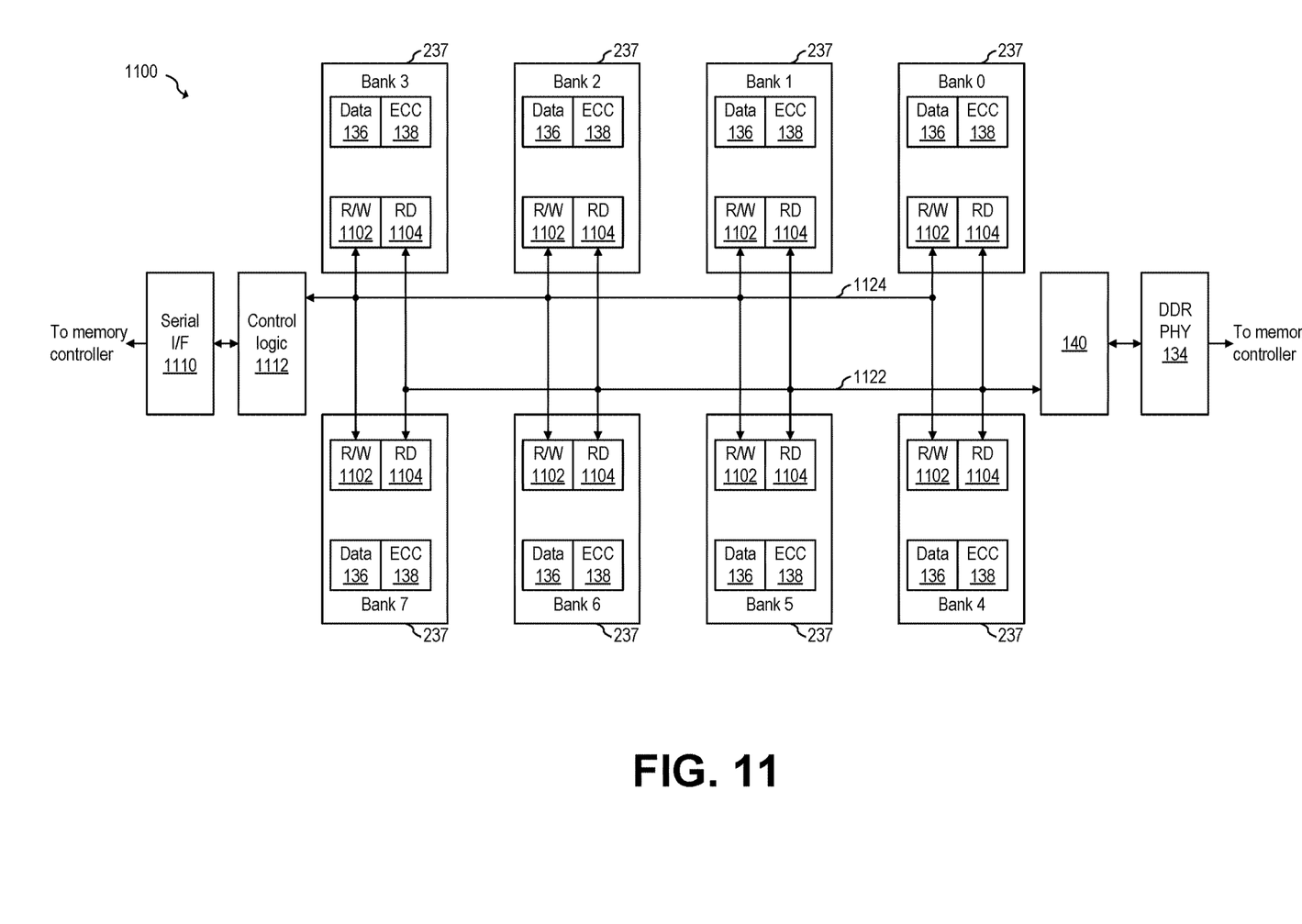
FIG. 11 shows a schematic diagram of a memory, according to an embodiment of the present invention.

Figure ii shows a schematic diagram of memory 1100, according to an embodiment of the present invention. Memory 132 may be implemented as memory 1100. Memory 1100 includes serial interface 1110, control logic 1112, DDR PHY 134, data flow controller 140, 8 memory banks 237, and buses 1122 and 1124. Each memory bank 237 includes a data memory array 136, an ECC memory array 138 a read path 1104, and a read/write path 1102.

As shown in FIG. 11, each memory bank 237 may be access via DDR PHY 134 for read operations using bus 1122. Each memory bank 237 may be access via serial interface 1110 for read or write operations using bus 1124.

In some embodiments, a memory controller may perform write operations serially to any of the memory banks 237 using serial interface 1110. Such write operations may include writing data and associated ECC values to a particular memory bank 237.

In some embodiments, a memory controller (e.g., 102) may perform read operations in parallel mode using DDR PHY 134. Such read operations may include reading data and associated ECC values using DQ and DQS lines (e.g., as described with respect to FIGS. 1-10).

In some embodiments, the memory controller accessing memory 1100 via serial interface 1110 and the memory controller accessing memory 1100 via DDR PHY 134 are implemented in the same SoC, such as in the same microcontroller.

As shown in FIG. 11, in some embodiments, data flow controller 140 may be implemented external to memory banks 237. Other implementations are also possible. For example, in some embodiments, a portion of data flow controller 140 may be implemented inside memory banks 237. For example, in embodiments in which data flow controller 140 is implemented as data flow controller 240, state machine 234 may be implemented external to memory banks 237 while MUX 236 may be implemented inside each of memory banks 237. As another example, in embodiments in which data flow controller 140 is implemented as data flow controller 740, state machine 734 may be implemented external to memory banks 237.

Serial interface 1110 may be implemented, e.g., as a serial peripheral interface SPI, such as a quad SPI (QSPI). In some embodiments, serial interface 1110 may be implemented in other ways known in the art.

Control logic 1112 is configured to control read and write operations into a particular memory bank 237 based on commands received by serial interface 1110. Control logic 1112 may be implemented in any way known in the art.

In some embodiments, parallel interface 134 may be implemented as a read-only interface (no write commands allowed).

In some embodiments, memory 1100 is a flash memory device implemented in an integrated circuit. In some embodiments, the flash memory device is a NOR flash memory device. In some embodiments, the flash memory device is a NAND flash memory device.

In some embodiments, memory 1100 is a volatile (e.g., DRAM type) memory device implemented in an integrated circuit.

Figure 12:
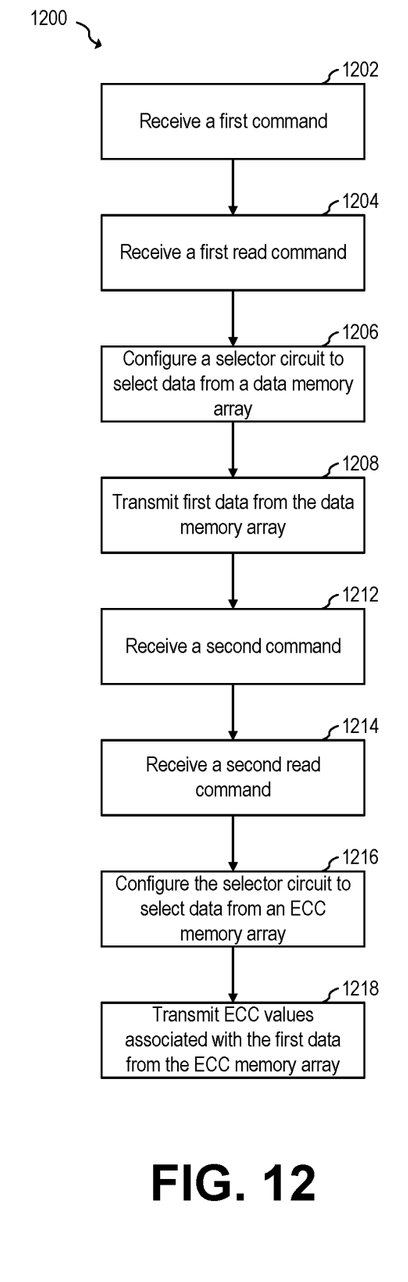
FIGS. 12 and 13 show flow charts of embodiment methods for operating a memory with ECC, according to embodiments of the present invention.

FIG. 12 shows a flow chart of embodiment method 1200 for operating a memory with ECC. Method 1200 may be implemented, e.g., by memory 232.

During step 1202, a first command is received via control lines (e.g., CA, CS, using CK) by a parallel interface (e.g., 134). During step 1204, a first read command (e.g., for reading first data) is received via the control lines.

During step 1206, a selector circuit (e.g., 236) is configured to select data from a data memory array (e.g., 136) instead of from an ECC memory array (e.g., 138) based on one or more bits of the first command (1202) or the first read command (1204). For example, as shown in FIGS. 3 and 4A, in some embodiments, the first command (e.g., $CMD_1$) may include a plurality of bits in particular states that together form an instruction to cause, e.g., state machine 234 to configured MUX 236 to select input $D_{136}$. As another example, as shown in FIGS. 3 and 5, the first command ($CMD_1$) may be an activate command that includes one bit (e.g., 502) in a particular state (e.g., low) to cause, e.g., state machine 234 to configured MUX 236 to select input $D_{136}$. As yet another example, as shown in FIGS. 3 and 6, the first command ($CMD_1$) may be an activate command, and the first read command may include one bit (e.g., 602) in a particular state (e.g., low) to cause, e.g., state machine 234 to configured MUX 236 to select input $D_{136}$.

During step 1208, the parallel interface transmits, via data lines (e.g., DQ using DQS), data from the output of the selector circuit (which at this point is selecting data from $D_{136}$ because of step 1206).

During step 1212, a second command is received via the control lines. During step 1204, a second read command (e.g., for reading the first data) is received via the control lines.

During step 1216, the selector circuit is configured to select data from the ECC memory array based on one or more bits of the second command (1212) or the second read command (1214). For example, as shown in FIGS. 3 and 4A, in some embodiments, the second command (e.g., $CMD_2$) may include a plurality of bits in particular states that together form an instruction to cause, e.g., state machine 234 to configured MUX 236 to select input $D_{138}$ (and, e.g., the first and second read commands may be identical). As another example, as shown in FIGS. 3 and 5, the second command ($CMD_2$) may be an activate command that includes one bit (e.g., 502) in a particular state (e.g., high) to cause, e.g., state machine 234 to configured MUX 236 to select input $D_{138}$ (and, e.g., the first and second read commands may be identical). As yet another example, as shown in FIGS. 3 and 6, the first command ($CMD_2$) may be an activate command, and the second read command may include one bit (e.g., 602) in a particular state (e.g., high) to cause, e.g., state machine 234 to configured MUX 236 to select input $D_{138}$.

During step 1218, the parallel interface transmits, via the data lines, data from the output of the selector circuit (which at this point is selecting data from $D_{138}$ because of step 1216). Thus, in some embodiments, during step 1208, the parallel interface transmits via the data lines ECC values associated with the first data transmitted during step 1208.

In some embodiments, method 1200 is compatible and complies with the LPDDR4 standard.

Figure 13:
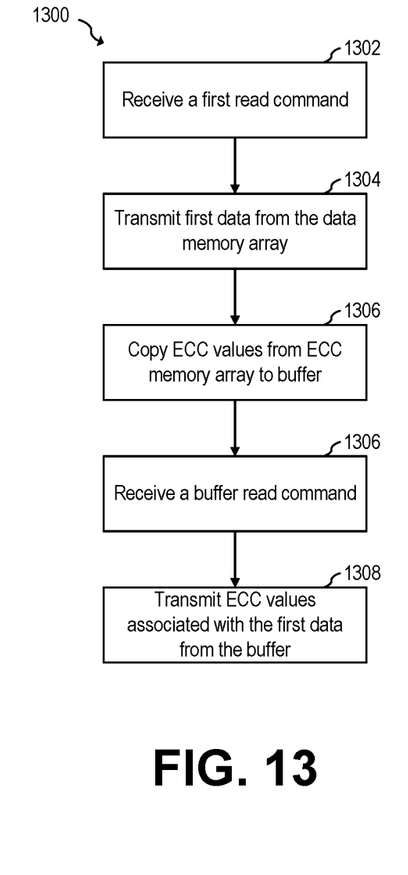

FIG. 13 shows a flow chart of embodiment method 1300 for operating a memory with ECC. Method 1300 may be implemented, e.g., by memory 732.

During step 1302, a first read command (e.g., for reading first data) is received via control lines (e.g., CA, CS, using CK) by a parallel interface (e.g., 134).

During step 1304, the parallel interface transmits, via data lines (e.g., DQ using DQS), first data from a data memory array (e.g., 136).

During step 1306, ECC values associated with the first data are copied from an ECC memory array (e.g., 138) and into a buffer (e.g., 736). In some embodiments, step 1306 is performed (e.g., at least partially) simultaneously with step 1304. In some embodiments, step 1306 is performed after step 1304. In some embodiments, step 1306 is performed before step 1304.

During step 1306, a buffer read command (e.g., $CMD_3$, e.g., as shown in FIG. 9) is received via the control lines.

During step 1308, the parallel interface transmits via the data lines data from the buffer. Thus, in some embodiments, during step 1308, the parallel interface transmits via the data lines ECC values associated with the first data transmitted during step 1304.

In some embodiments, method 1300 is compatible and complies with the LPDDR4 standard.

Example embodiments of the present invention are summarized here. Other embodiments can also be understood from the entirety of the specification and the claims filed herein.

Example 1. A method including: receiving, via control lines of a parallel interface of a memory device, a first command; after receiving the first command, receiving, via the control lines, a first read command, where the first command or the first read command includes one or more bits indicative of a first selection, where the first selection causes a selector circuit to select data from a data memory portion of the memory device, and where a second selection causes the selector circuit to select data from an error correction code (ECC) memory portion; after receiving the first read command and the first selection, providing, via data lines of the parallel interface, first data from the data memory portion using the selector circuit, where the provided first data is associated with the first read command; receiving, via the control lines, a second command; after receiving the second command, receiving, via the control lines, a second read command, where the second command or the second read command includes one or more bits indicative of the second selection; and after receiving the second read command and the second selection, providing, via the data lines, first ECC values from the ECC memory portion using the selector circuit, where the first ECC values are associated with the first data.

Example 2. The method of example 1, where the first command includes the one or more bits indicative of the first selection, where the second command includes the one or more bits indicative of the second selection, and where the first read command is identical to the second read command.

Example 3. The method of one of examples 1 or 2, further including: after receiving the first command and before receiving the first read command, receiving, via the control lines, a first activate command; and after receiving the second command and before receiving the second read command, receiving, via the control lines, a second activate command.

Example 4. The method of one of examples 1 to 3, where: the control lines include a chip select line, and first, second, third, fourth, fifth and sixth command address lines; receiving one of the first command or the second command includes: receiving the chip select line in a high state followed by the chip select line in a low state, when the chip select line is in the high state, receiving the first, second, third, fourth, and fifth command address lines in the low state and the sixth command address line in the high state, and when the chip select line is in the low state, receiving the first, second, fourth, and fifth command address lines in the low state and the third and sixth command address lines in the high state; and receiving the other of the first command or the second command includes: receiving the chip select line in the high state followed by the chip select line in the low state, when the chip select line is in the high state, receiving the first, second, third, fourth, and fifth command address lines in the low state and the sixth command address line in the high state, and when the chip select line is in the low state, receiving the first, second, third, and fifth command address lines in the low state and the fourth and sixth command address lines in the high state.

Example 5. The method of one of examples 1 to 2, where: the control lines include a chip select line, and first, second, third, fourth, fifth and sixth command address lines; receiving one of the first command or the second command includes: receiving a first activate command that includes first and second portions, where receiving the first portion of the first activate command includes receiving the chip select line in a high state followed by the chip select line in a low state, when, during the first portion of the first activate command, the chip select line is in the high state, receiving the first command address line in the high state and the second command address line in the low state, and when, during the first portion of the first activate command, the chip select line is in the low state, receiving the fourth command address line in the low state; and receiving the other of the first command or the second command includes: receiving a second activate command that includes first and second portions, where receiving the first portion of the second activate command includes receiving the chip select line in the high state followed by the chip select line in the low state, when, during the first portion of the second activate command, the chip select line is in the high state, receiving the first command address line in the high state and the second command address line in the low state, and when, during the first portion of the second activate command, the chip select line is in the low state, receiving the fourth command address line in the high state.

Example 6. The method of one of examples 1 to 2, where the first command is a first activate command, where the second command is a second activate command, where the first read command includes the one or more bits indicative of the first selection, and where the second read command includes the one or more bits indicative of the second selection.

Example 7. The method of one of examples 1 to 2 and 6, where: the control lines include a chip select line, and first, second, third, fourth, fifth and sixth command address lines; receiving one of the first command or the second command includes: receiving the chip select line in a high state followed by the chip select line in a low state, when the chip select line is in the high state, receiving the first, third, fourth, and fifth command address lines in the low state and the second command address line in the high state, and when the chip select line is in the low state, receiving the fourth command address line in the low state; and receiving the other of the first command or the second command includes: receiving the chip select line in the high state followed by the chip select line in the low state, when the chip select line is in the high state, receiving the first, third, fourth, and fifth command address lines in the low state and the second command address line in the high state, and when the chip select line is in the low state, receiving the fourth command address line in the high state.

Example 8. The method of one of examples 1 to 7, where the parallel interface is compatible with the LPDDR4 standard.

Example 9. The method of one of examples 1 to 2 and 6 to 8, where the first read command includes the one or more bits indicative of the first selection, and where the second read command includes the one or more bits indicative of the second selection.

Example 10. The method of one of examples 1 to 4 and 8, where the first command includes the one or more bits indicative of the first selection, and where the second command includes the one or more bits indicative of the second selection.

Example 11. The method of one of examples 1 to 2, 5, 8 and 10, where the first and second commands are activate commands according to the LPDDR4 standard.

Example 12. The method of one of examples 1 to 4, 8 and 10, where the first and second command are multipurpose commands (MPCs) according to the LPDDR4 standard.

Example 13. The method of one of examples 1 to 12, where the parallel interface complies with a digital communication standard defined by a standard organization.

Example 14. A method including: receiving, via control lines of a parallel interface of a memory device, a first read command; in response to receiving the first read command: providing, via data lines of the parallel interface, first data from a first memory portion, where the provided first data is associated with the first read command, and copying first error correction code (ECC) values from an ECC memory portion of the memory device to a buffer, where the first ECC values are associated with the first data; after receiving the first read command, receiving, via the control lines, a buffer read command; and after receiving the buffer read command, providing, via the data lines, the first ECC values from the buffer.

Example 15. The method of example 14, where: the control lines include a chip select line, and first, second, third, fourth, fifth and sixth command address lines; and receiving the buffer read command includes: receiving the chip select line in a high state followed by the chip select line in a low state, when the chip select line is in the high state, receiving the first, second, third, fourth, and fifth command address lines in the low state and the sixth command address line in the high state, and when the chip select line is in the low state, receiving the second, third, fourth, fifth, and sixth command address lines in the low state and the first command address line in the high state.

Example 16. The method of one of examples 14 or 15, where the parallel interface complies with a digital communication standard defined by a standard organization.

Example 17. The method of one of examples 14 to 16, where the parallel interface is compatible with the LPDDR4 standard.

Example 18. The method of one of examples 14 to 17, where the buffer read command is a multipurpose command (MPC) according to the LPDDR4 standard.

Example 19. The method of one of examples 14 to 18, where the buffer includes a first-in-first-out (FIFO) buffer.

Example 20. An integrated circuit including: a parallel interface configured to receive commands via control lines and configured to deliver data via data lines; a data memory portion configured to store data; an error correction code (ECC) memory portion configured to store ECC values associated with the data stored in the data memory portion; a buffer; a selector circuit having a first input coupled to a data output of the data memory portion, and a second input coupled to a data output of the ECC memory portion; and a controller configured to: after reception, by the parallel interface, of a first read command via the control lines, cause the selector circuit to select the first input and cause the parallel interface to provide, via the data lines, first data from the first input of the selector circuit, where the provided first data is associated with the first read command, after reception, by the parallel interface, of a second command via the control lines, cause the selector circuit to select the second input and cause the parallel interface to provide, via the data lines, first ECC values using from the second input of the selector circuit, where the first ECC values are associated with the first data.

Example 21. The integrated circuit of example 20, where the second input of the selector circuit is coupled to the ECC memory portion via the buffer, where a data output of the buffer is coupled to the second input and a data input of the buffer is coupled to the ECC memory portion.

Example 22. The integrated circuit of one of examples 20 or 21, where the second command is a read buffer command, where, after reception, by the parallel interface, of the first read command via the control lines, the controller is configured to copy the first ECC values from the ECC memory portion to the buffer, and where, after reception, by the parallel interface, of the second command via the control lines, cause the selector circuit to select the second input and cause the parallel interface to provide, via the data lines, the first ECC values from the buffer.

Example 23. The integrated circuit of example 20, where the controller is configured to: cause the selector circuit to select the first input based on one or more bits of a first activate command received prior to the reception of the first read command; and cause the selector circuit to select the second input based on one or more bits of a second activate command received prior to the reception of the second command, where the second command is a second read command.

Example 24. The integrated circuit of one of examples 20 to 23, where the controller includes a state machine.

Example 25. The integrated circuit of one of examples 20 to 24, where the controller includes the selector circuit.

Example 26. The integrated circuit of one of examples 20 to 25, where the ECC memory portion is smaller than the data memory portion.

Example 27. The integrated circuit of one of examples 20 to 26, further including a plurality of memory banks, where a first memory bank of the plurality of memory banks includes the data memory portion and the ECC memory portion.

Example 28. The integrated circuit of one of examples 20 to 27, where the parallel interface is compatible with the LPDDR4 standard.

Example 29. The integrated circuit of one of examples 20 to 28, where the integrated circuit is a flash memory device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:

receiving, via control lines of a parallel interface of a memory device, a first command;

after receiving the first command, receiving, via the control lines, a first read command, wherein the first command or the first read command comprises one or more bits indicative of a first selection, wherein the first selection causes a selector circuit to select data from a data memory portion of the memory device, and wherein a second selection causes the selector circuit to select data from an error correction code (ECC) memory portion;

after receiving the first read command and the first selection, providing, via data lines of the parallel interface, first data from the data memory portion using the selector circuit, wherein the provided first data is associated with the first read command;

receiving, via the control lines, a second command;

after receiving the second command, receiving, via the control lines, a second read command, wherein the second command or the second read command comprises one or more bits indicative of the second selection; and after receiving the second read command and the second selection, providing, via the data lines, first ECC values from the ECC memory portion using the selector circuit, wherein the first ECC values are associated with the first data.

2. The method of claim 1, wherein the first command comprises the one or more bits indicative of the first selection, wherein the second command comprises the one or more bits indicative of the second selection, and wherein the first read command is identical to the second read command.

3. The method of claim 2, further comprising:

after receiving the first command and before receiving the first read command, receiving, via the control lines, a first activate command; and after receiving the second command and before receiving the second read command, receiving, via the control lines, a second activate command.

4. The method of claim 3, wherein:

the control lines comprise a chip select line, and first, second, third, fourth, fifth and sixth command address lines;

receiving one of the first command or the second command comprises:

receiving the chip select line in a high state followed by the chip select line in a low state, when the chip select line is in the high state, receiving the first, second, third, fourth, and fifth command address lines in the low state and the sixth command address line in the high state, and when the chip select line is in the low state, receiving the first, second, fourth, and fifth command address lines in the low state and the third and sixth command address lines in the high state; and receiving the other of the first command or the second command comprises:

receiving the chip select line in the high state followed by the chip select line in the low state, when the chip select line is in the high state, receiving the first, second, third, fourth, and fifth command address lines in the low state and the sixth command address line in the high state, and when the chip select line is in the low state, receiving the first, second, third, and fifth command address lines in the low state and the fourth and sixth command address lines in the high state.

5. The method of claim 2, wherein:

the control lines comprise a chip select line, and first, second, third, fourth, fifth and sixth command address lines;

receiving one of the first command or the second command comprises:

receiving a first activate command that comprises first and second portions, wherein receiving the first portion of the first activate command comprises receiving the chip select line in a high state followed by the chip select line in a low state, when, during the first portion of the first activate command, the chip select line is in the high state, receiving the first command address line in the high state and the second command address line in the low state, and when, during the first portion of the first activate command, the chip select line is in the low state, receiving the fourth command address line in the low state; and receiving the other of the first command or the second command comprises:

receiving a second activate command that comprises first and second portions, wherein receiving the first portion of the second activate command comprises receiving the chip select line in the high state followed by the chip select line in the low state, when, during the first portion of the second activate command, the chip select line is in the high state, receiving the first command address line in the high state and the second command address line in the low state, and when, during the first portion of the second activate command, the chip select line is in the low state, receiving the fourth command address line in the high state.

6. The method of claim 1, wherein the first command is a first activate command, wherein the second command is a second activate command, wherein the first read command comprises the one or more bits indicative of the first selection, and wherein the second read command comprises the one or more bits indicative of the second selection.

7. The method of claim 6, wherein:

the control lines comprise a chip select line, and first, second, third, fourth, fifth and sixth command address lines;

receiving one of the first command or the second command comprises:

receiving the chip select line in a high state followed by the chip select line in a low state, when the chip select line is in the high state, receiving the first, third, fourth, and fifth command address lines in the low state and the second command address line in the high state, and when the chip select line is in the low state, receiving the fourth command address line in the low state; and receiving the other of the first command or the second command comprises:

receiving the chip select line in the high state followed by the chip select line in the low state, when the chip select line is in the high state, receiving the first, third, fourth, and fifth command address lines in the low state and the second command address line in the high state, and when the chip select line is in the low state, receiving the fourth command address line in the high state.

8. The method of claim 1, wherein the parallel interface is compatible with the LPDDR4 standard or with another digital communication standard defined by a standard organization.

9. The method of claim 8, wherein the first read command comprises the one or more bits indicative of the first selection, and wherein the second read command comprises the one or more bits indicative of the second selection.

10. The method of claim 8, wherein the first command comprises the one or more bits indicative of the first selection, and wherein the second command comprises the one or more bits indicative of the second selection.

11. The method of claim 10, wherein the first and second commands are activate commands according to the LPDDR4 standard.

12. The method of claim 10, wherein the first and second command are multipurpose commands (MPCs) according to the LPDDR4 standard.

13. A method comprising:
receiving, via control lines of a parallel interface of a memory device, a first read command;
in response to receiving the first read command:
providing, via data lines of the parallel interface, first data from a first memory portion, wherein the provided first data is associated with the first read command, and
copying first error correction code (ECC) values from an ECC memory portion of the memory device to a buffer, wherein the first ECC values are associated with the first data;
after receiving the first read command, receiving, via the control lines, a buffer read command; and
after receiving the buffer read command, providing, via the data lines, the first ECC values from the buffer.

14. The method of claim 13, wherein:
the control lines comprise a chip select line, and first, second, third, fourth, fifth and sixth command address lines; and
receiving the buffer read command comprises:
receiving the chip select line in a high state followed by the chip select line in a low state,
when the chip select line is in the high state, receiving the first, second, third, fourth, and fifth command address lines in the low state and the sixth command address line in the high state, and
when the chip select line is in the low state, receiving the second, third, fourth, fifth, and sixth command address lines in the low state and the first command address line in the high state.

15. The method of claim 13, wherein the parallel interface is compatible with the LPDDR4 standard or complies with a digital communications standard defined by a standard organization.

16. The method of claim 15, wherein the buffer read command is a multipurpose command (MPC) according to the LPDDR4 standard.

17. The method of claim 13, wherein the buffer comprises a first-in-first-out (FIFO) buffer.

18. An integrated circuit comprising:
a parallel interface configured to receive commands via control lines and configured to deliver data via data lines;
a data memory portion configured to store data;
an error correction code (ECC) memory portion configured to store ECC values associated with the data stored in the data memory portion;
a buffer;
a selector circuit having a first input coupled to a data output of the data memory portion, and a second input coupled to a data output of the ECC memory portion; and
a controller configured to:
after reception, by the parallel interface, of a first read command via the control lines, cause the selector circuit to select the first input and cause the parallel interface to provide, via the data lines, first data from the first input of the selector circuit, wherein the provided first data is associated with the first read command,
after reception, by the parallel interface, of a second command via the control lines, cause the selector circuit to select the second input and cause the parallel interface to provide, via the data lines, first ECC values using from the second input of the selector circuit, wherein the first ECC values are associated with the first data.

19. The integrated circuit of claim 18, wherein the second input of the selector circuit is coupled to the ECC memory portion via the buffer, wherein a data output of the buffer is coupled to the second input and a data input of the buffer is coupled to the ECC memory portion.

20. The integrated circuit of claim 19, wherein the second command is a read buffer command, wherein, after reception, by the parallel interface, of the first read command via the control lines, the controller is configured to copy the first ECC values from the ECC memory portion to the buffer, and wherein, after reception, by the parallel interface, of the second command via the control lines, cause the selector circuit to select the second input and cause the parallel interface to provide, via the data lines, the first ECC values from the buffer.

21. The integrated circuit of claim 18, wherein the controller is configured to:
cause the selector circuit to select the first input based on one or more bits of a first activate command received prior to the reception of the first read command; and
cause the selector circuit to select the second input based on one or more bits of a second activate command received prior to the reception of the second command, wherein the second command is a second read command.

22. The integrated circuit of claim 18, wherein the controller comprises a state machine and further comprises the selector circuit.

23. The integrated circuit of claim 18, wherein the ECC memory portion is smaller than the data memory portion.

24. The integrated circuit of claim 18, further comprising a plurality of memory banks, wherein a first memory bank of the plurality of memory banks comprises the data memory portion and the ECC memory portion.

25. The integrated circuit of claim 18, wherein the parallel interface is compatible with the LPDDR4 standard and the integrated circuit is a flash memory device.

* * * * *